United States Patent
Kim et al.

(10) Patent No.: US 8,554,294 B2
(45) Date of Patent: Oct. 8, 2013

(54) LOW-NOISE COOLING APPARATUS

(75) Inventors: Ki-woong Kim, Daejeon (KR); Chan Seok Kang, Daejeon (KR); Seong-min Hwang, Daejeon (KR); Seong-Joo Lee, Daejeon (KR); Yong-Ho Lee, Daejeon (KR)

(73) Assignee: Korea Research Institute of Standards and Science (KR)

( * ) Notice: Subject to any disclaimer, the term of this patent is extended or adjusted under 35 U.S.C. 154(b) by 0 days.

(21) Appl. No.: 13/492,496

(22) Filed: Jun. 8, 2012

(65) Prior Publication Data

US 2012/0252678 A1    Oct. 4, 2012

Related U.S. Application Data

(63) Continuation of application No. PCT/KR2010/008145, filed on Nov. 18, 2010.

(30) Foreign Application Priority Data

Dec. 29, 2009    (KR) .................. 10-2009-0132781

(51) Int. Cl.
    *G01R 33/035* (2006.01)
(52) U.S. Cl.
    USPC ........................................... 505/162
(58) Field of Classification Search
    USPC ............... 505/162, 163, 844, 846; 324/348
    See application file for complete search history.

(56) References Cited

U.S. PATENT DOCUMENTS

| | | | |
|---|---|---|---|
| 6,563,312 B2 * | 5/2003 | Saho et al. ............ | 324/248 |
| 7,187,169 B2 | 3/2007 | Clarke et al. | |
| 2002/0024338 A1 * | 2/2002 | Saho et al. ............ | 324/248 |
| 2006/0091771 A1 * | 5/2006 | Teskey ............... | 312/334.44 |

FOREIGN PATENT DOCUMENTS

| | | |
|---|---|---|
| JP | P2002-76453 A | 3/2002 |
| KR | 10-0548802 B | 6/2005 |

OTHER PUBLICATIONS

International Search Report for PCT/KR2010/008145 dated Jun. 24, 2011.

* cited by examiner

*Primary Examiner* — Colleen Dunn
(74) *Attorney, Agent, or Firm* — Jenkins, Wilson, Taylor & Hunt, P.A.

(57) ABSTRACT

A low-noise cooling apparatus is provided. The cooling apparatus includes an outer container and an inner container. A thermal insulation layer in a vacuum state is disposed between the outer container and the inner container. The inner container includes a Dewar containing a liquid refrigerant, a prepolarization coil arranged inside the inner container and immersed in the liquid refrigerant, a pick-up coil immersed in the liquid refrigerant, and a superconducting quantum interference device (SQUID) electrically connected to the pick-up coil and immersed in the liquid refrigerant. The prepolarization coil is made of a superconductor.

17 Claims, 11 Drawing Sheets

LOW-NOISE COOLING APPARATUS

CROSS-REFERENCE TO RELATED APPLICATIONS

This application is a continuation of and claims priority to PCT/KR2010/008145 filed Nov. 18, 2010, which claims priority to Korea Patent Application No. 10-2009-0132781 filed on Dec. 29, 2009, the entireties of which are both hereby incorporated by reference.

BACKGROUND OF THE INVENTION

1. Field of the Invention

The present invention relates to nuclear magnetic resonance (NMR) apparatuses and, more particularly, to a low magnetic field/very low magnetic field NMR apparatus.

2. Description of the Related Art

Nuclear magnetic resonance (hereinafter referred to as "NMR") is a phenomenon involved with precession of the magnetic spin of an atomic nucleus arising from resonance of the magnetic spin of the nucleus under a strong magnetic field when the magnetic field is applied to the atomic nucleus. Magnetic resonance imaging (hereinafter referred to as "MRI") is a non-invasive technique of imaging the inner part of a target object by detecting electromagnetic waves generated during the precession using the NMR. The MRI is widely used as a medical diagnostics tool to image the inner part of human body.

Sensitivity of an MRI image is in proportion to a magnetization (polarization) strength and a resonant frequency of a nucleus. In general, a very strong main magnetic field using a superconducting magnet is applied to a target material to improve the sensitivity of the MRI image. Thus, the magnetization strength and the resonant frequency of the nucleus increase.

Relaxation time of an NMR signal is in inverse proportion to uniformity of the main magnetic field. Thus, strength and uniformity of the main magnetic field are important.

High cost is required to product a superconducting magnet generating a uniform magnetic field having a strength of several Tesla (T). In addition, the operation of the superconducting magnet uses liquid helium that is an expensive refrigerant. Thus, maintenance cost of an MRI system using the superconducting magnet increases.

A low/very low magnetic field NMR and MRI (hereinafter integrally referred to as "low magnetic field MRI") is a new conceptual MRI apparatus operating at a magnetic filed having a strength of several micro Tesla to hundreds of micro Tesla. In a conventional MRI apparatus, a magnetization strength and a resonant frequency of a nucleus increase to improve sensitivity of an image. However, in the low magnetic field MRI apparatus, a main magnetic field generated from a magnet of a conventional MRI apparatus is split into a prepolarization magnetic field and a measurement magnetic field. The measurement magnetic field may have a strength of about several micro Tesla (uT) to about tens of uT.

SUMMARY OF THE INVENTION

Embodiments of the present invention provide a prepolarization coil-SQUID integrated magnetic filed measuring apparatus.

Embodiments of the present invention also provide a cooling apparatus with a non-conductive auxiliary thermal shield layer to reduce thermal noise.

In an aspect of the present invention, there is provided a low-noise cooling apparatus which may include an outer container and an inner container. A thermal insulation layer in a vacuum state may be formed between the outer container and the inner container. The inner container may include a Dewar containing a liquid refrigerant, a prepolarization coil arranged inside the inner container and immersed in the liquid refrigerant, a pick-up coil immersed in the liquid refrigerant, and a SQUID electrically connected to the pick-up coil and immersed in the liquid refrigerant. The prepolarization coil may be made of a superconductor.

In another aspect of the present invention, there is provided a low-noise cooling apparatus which may include an outer container; an inner container disposed inside the outer container and including an inner neck part and an inner body part; at least one conductive thermal shield layer connected to the inner neck part and disposed to cover at least a side of the inner body part; a non-conductive auxiliary thermal shield layer disposed in contact with the conductive thermal shield layer in a region adjacent to a sample disposed below the outer container; a prepolarization coil disposed inside the inner container and immersed in a liquid refrigerant; a pick-up coil disposed on the central axis of the prepolarization and immersed in the liquid refrigerant; and a superconducting quantum interference device (SQUID) electrically connected to the pick-up coil and immersed in the liquid refrigerant. A gap between the outer container and the inner container is functioned as a thermal insulation layer in vacuum.

BRIEF DESCRIPTION OF THE DRAWINGS

The present invention will become more apparent in view of the attached drawings and accompanying detailed description. The embodiments depicted therein are provided by way of example, not by way of limitation, wherein like reference numerals refer to the same or similar elements. The drawings are not necessarily to scale, emphasis instead being placed upon illustrating aspects of the present invention.

DETAILED DESCRIPTION OF EMBODIMENTS

Figure 1:
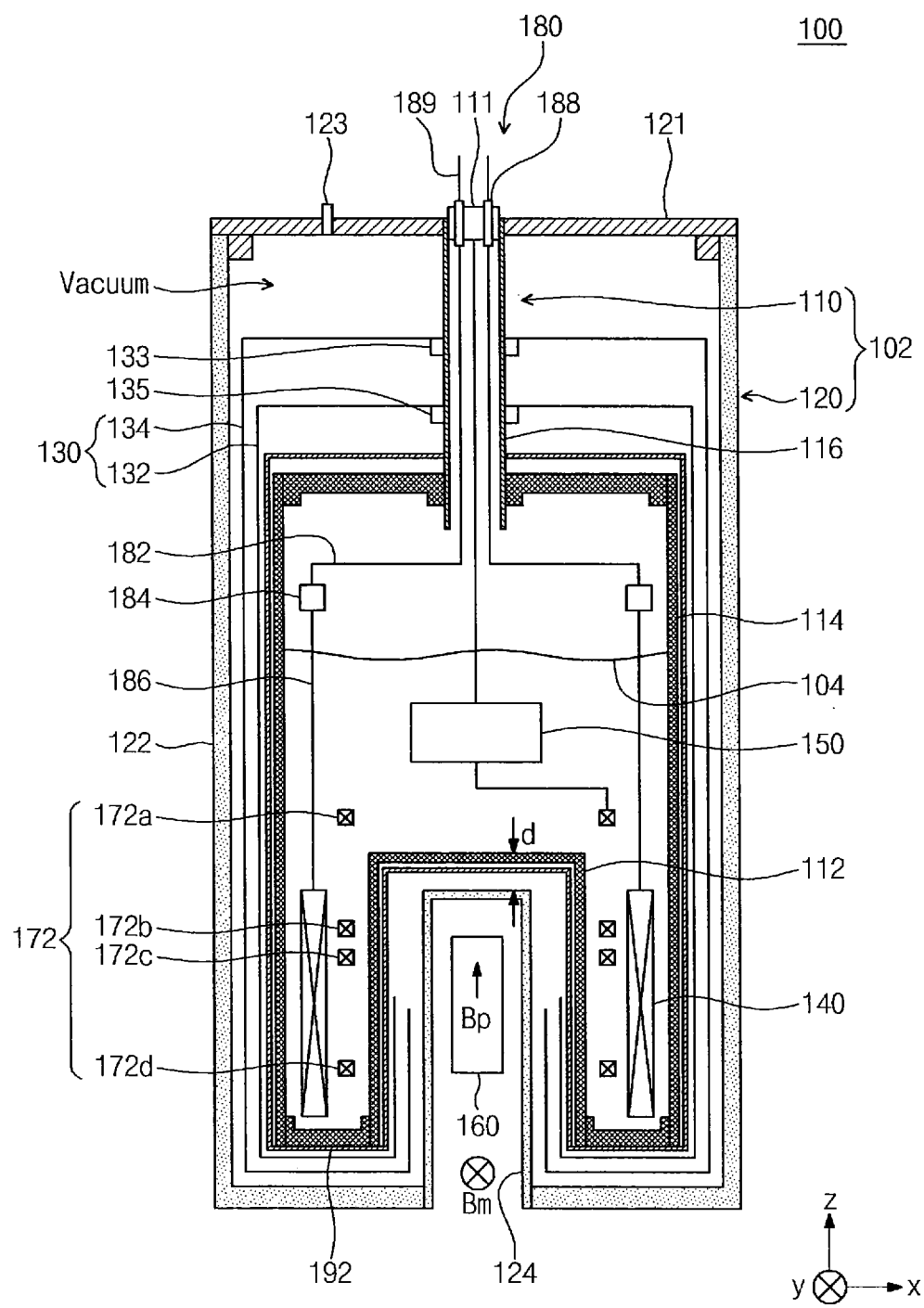
FIG. 1 illustrates a low-noise cooling apparatus according to one embodiment of the present invention.

A low magnetic field MRI may sequentially apply a prepolarization magnetic field Bp and a measurement magnetic field Bm to a sample. The prepolarization magnetic field Bp may be turned off after prepolarizing the sample. In addition, the prepolarization magnetic field Bp has a much higher strength than the measurement magnetic field Bm to sufficiently polarize (magnetize) the sample. When the prepolarization magnetic field Bp is turned off, polarized proton spins are required to precess in resonance with the measurement magnetic field Bm. Accordingly, the precessing spins may generate an electromagnetic wave and an electromagnetic wave signal may be measured.

The prepolarization magnetic field Bp and the measurement magnetic field are applied using independent coils that are different from each other. The prepolarization magnetic field Bp is generated by a prepolarization coil, and the measurement magnetic field Bm is generated by a measurement magnetic field coil. The prepolarization magnetic field Bp may need only be a magnetic field having a strength enough to polarize the sample irrespective of its uniformity. Additionally, the measurement magnetic field Bm may need only be a uniform magnetic field with low strength. Accordingly, the low magnetic field MRI may constitute a system with much simpler structure and lower cost than a conventional high magnetic field MRI using a superconducting magnet that need to produce a magnetic field of both high strength and high uniformity.

A proton relaxation signal generated by the measurement magnetic field Bm is a low-frequency signal having a frequency of tens to hundreds of hertz (Hz). In a conventional high magnetic field MRI, a Faraday induction coil is used as a receiver coil to measure the relaxation signal. A signal-to-noise ratio (SNR) of the Faraday induction coil is in proportion to a frequency of a measured relaxation signal. For this reason, the Faraday induction coil is not suitable for measuring the relaxation signal of the low magnetic field MRI having a low frequency. Thus, the low magnetic field MRI may use a superconducting quantum interference device magnetic field sensor (hereinafter referred to as "SQUID sensor") whose signal-to-noise ratio (SNR) does not depend on the frequency of the measured relaxation signal, in place of the Faraday induction coil.

A low magnetic field MRI may operate in a magnetic field having a strength of micro Tesla (uT) using the SQUID. The low magnetic field MRI is capable of imaging the inside of an object using a resonance signal having a band of several to tens of hertz (Hz) in proportion to the strength of a measurement magnetic field Bm. The low magnetic field MRI may reduce distortion caused by metal inside or around an imaging target. Accordingly, the low magnetic field MRI may exhibit phenomena that do not occur at a conventional high magnetic field MRI. The low magnetic field MRI may be used without difficulty to person who wear a metal prosthesis or a cardiac pacemaker. In addition, the low magnetic field MRI may non-invasively obtain an inner image of a metal can. Thus, the low magnetic field MRI may be applied to scanning equipments to complement X-ray that is widely used in security images.

The low magnetic field MRI may include a prepolarization coil for polarizing a sample, a measurement magnetic field coil for determining relaxation characteristics of a proton spin of the polarized sample, a SQUID sensor configured to read an NMR signal, and a cooling system configured to cool the SQUID sensor below a critical temperature.

Typically, the prepolarization coil may generate a magnetic field having a strength of about tens to hundreds of milliTesla to sufficiently polarize a sample. Current of tens to hundreds of amperes (A) may flow through the prepolarization coil. However, when a current of hundreds of amperes flows through the prepolarization coil made of copper, which is a resistive conductor, the prepolarization coil may generate Joule heating on the order of a kilowatt (kW). The Joule heating of the prepolarization coil may easily decrease with a thicker conductor with low resistance per unit length. However, the volume of the coil may increase as the thickness of the conductor increases. Accordingly, a method of cooling the prepolarization coil to decrease the conductor resistivity may be most efficient. That is, since resistivity of metal decreases with lower temperature, it is advantageous to cool the prepolarization coil as low a temperature as possible.

Generally, a resistive prepolarization coil may be cooled using a refrigerant such as liquid nitrogen or liquid helium. Liquid helium (4.2 K) may provide a much lower temperature than liquid nitrogen (77 K). Accordingly, when the resistive prepolarization coil is cooled using liquid helium, resistivity of the resistive prepolarization coil may be further reduced. In addition, a SQUID sensor and a prepolarization coil may be cooled using a single Dewar. However, latent heat of vaporization of liquid helium is at least 100 times smaller than that of liquid nitrogen. Accordingly, more liquid helium is required to absorb the same amount of heat than liquid nitrogen. Also, since the cost of liquid helium is about 100 times higher than that of liquid nitrogen, it is not realistic to cool the resistive prepolarization coil with the liquid helium.

The resistive prepolarization coil may be located inside a liquid helium Dewar in which a SQUID sensor is mounted. In this case, liquid helium may cause vibration while boiling by absorbing heat of the resistive prepolarization coil. The vibration caused by the helium gas may be transferred to the SQUID sensor to deteriorate operating characteristics of the SQUID sensor.

A separate Dewar containing liquid nitrogen may be used to cool the resistive prepolarization coil. In this case, besides the liquid helium Dewar in which the SQUID sensor is mounted, there is required a separate liquid nitrogen Dewar in which the prepolarization coil is to be located. However, since the liquid nitrogen Dewar and the liquid helium Dewar need minimum consumption of refrigerants, a degree of difficulty of their manufacturing is high and their costs are also high. That is, use of two types of Dewars is not desirable in consideration of system complexity and high costs.

A low magnetic field MRI using a SQUID sensor suffers from a separate problem that characteristics of the SQUID sensor is deteriorated by a material for use in manufacturing of a Dewar. A liquid helium Dewar includes a thermal insulation layer in a vacuum state between inner and outer walls of the Dewar to improve thermal insulation characteristics. A thermal shield may be disposed within the thermal insulation layer. The thermal shield prevents radiant heat coming from the outside of the Dewar from transferring into the inner wall of the Dewar. The thermal shield is mostly made of a metallic material.

A low magnetic field MRI system using a SQUID sensor may effectively detect a signal because an attenuation rate of the signal decreases as a distance between a sample and a pick-up coil of the SQUID sensor decreases. Accordingly, a thickness of a thermal insulation layer of a Dewar for cooling should be small as possible. In this case, the pick-up coil of the SQUID sensor comes near to the sample and the thermal shield Inherent thermal noise of the metallic thermal insulation layer causes noise of the SQUID sensor to increase.

A Dewar for the purpose of cooling of a SQUID sensor may inevitably use a thermal shield. However, the use of the thermal shield is suppressed as much as possible to reduce an influence on the SQUID sensor. Although less amount of a liquid nitrogen in nitrogen Dewar is used than that of a liquid helium in helium Dewar because a temperature of liquid nitrogen is relatively higher than that of liquid helium, the liquid nitrogen Dewar is not a structure in which there is no thermal shield. Accordingly, the liquid nitrogen Dewar may provide a cause of additional noise in terms of reference of the SQUID sensor.

A low-noise cooling apparatus according to an embodiment of the present invention provides a Dewar shape optimized for a superconducting prepolarization coil-SQUID sensor integrated system. In addition, there is proposed a superconducting prepolarization coil arrangement which is capable of magnetizing a sample as strongly as possible.

A low-noise cooling apparatus according to an embodiment of the present invention uses an electronically non-conductive auxiliary thermal shield to overcome a thermal noise problem due to a metallic thermal insulation layer.

The present invention will be described in more detail hereinafter with reference to the accompanying drawings, in which preferred embodiments of the invention are shown. This invention may, however, be embodied in many different forms herein. Rather, these embodiments are provided so that this disclosure will be thorough and complete, and will fully convey the scope of the invention to those skilled in the art. In the drawings, like numbers refer to like references.

FIG. 1 illustrates a low-noise cooling apparatus 100 according to one embodiment of the present invention.

Referring to FIG. 1, the low-noise cooling apparatus 100 includes a Dewar 102. The Dewar 102 includes an outer container 120 and an inner container 110. A gap between the outer container 120 and the inner container 110 is functioned as a thermal insulation layer in vacuum. The inner container 110 includes a liquid refrigerant 104.

The low-noise cooling apparatus 100 includes a prepolarization coil 140 disposed inside the inner container 110 and immersed in the liquid refrigerant 104, a pick-up coil 172 immersed in the refrigerant 104, and a SQUID 150 electrically connected to the pick-up coil 172 and immersed in the liquid refrigerant 104. The prepolarization coil is made of superconductor.

The outer container 120 may include an outer body part 122 and an outer concave part 124 disposed at a lower surface of the outer body part 122 to cover a sample 160. The outer body part 124 may exhibit a cylindrical shape. The outer body part 124 may include an outer top plate 121. The outer top plate 121 may be attached to the outer body part 122. The outer top plate 121 may be made of a metallic material. The outer top plate 121 may includes a vacuum port 123 and a through-hole (not shown) formed in the center of the outer top plate 121. The vacuum port 123 may be connected to a vacuum pump (not shown). The outer concave part 124 may exhibit a cylindrical shape and have a depressed structure at a lower surface of the outer body part 122. The outer body part 122 and the outer concave part 124 may be fiber-reinforced plastic (FRP). Specifically, the outer body part 122 and the outer concave part 124 may be made of non-metallic G10-FRP.

The inner container 110 may include an inner neck part 116 connected to the outer top plate 121, an inner body part 114 connected to the inner neck part 116, and an inner concave part 112 connected to the inner body part 114 to cover the outer concave part 124. The inner concave part 112 may be disposed around the outer concave part 124. Each of the inner and outer containers 110 and container 120 may exhibit a cylindrical shape.

Diameter of the inner body part 114 may be smaller than that of the inner neck part 116. The diameter of the inner body part 114 may be greater than that of the inner concave part 112. The inner container 110 may be attached to the outer container 120 via the through-hole. Specifically, one end of the inner neck part 116 may be connected to the through-hole.

A thermal insulation layer may be formed in a space between the inner container 110 and the outer container 120. Air in the thermal insulation layer may be pumped out through the vacuum port 123 to establish vacuum. The inner container 110 may be fabricated of FRP. The inner body part 114 may exhibit a cylindrical shape. The inner concave part 112 may have a depressed structure at a lower surface of the inner body part 114. The inner concave part 114 may exhibit a cylindrical shape. A portion of the inner body part 114 may be filled with the liquid refrigerant 104. The liquid refrigerant 104 may be liquid helium or liquid nitrogen. The liquid refrigerant 104 may vary depending on materials of the SQUID 150 and the prepolarization coil 140.

The SQUID 140 may be a low-temperature superconductor SQUID (LTS SQUID). The LTS SQUID may use Nb/AlOx/Nb Josephson junction. Magnetic field sensitivity of the LTS SQUID may be about 1-2 $fT/\sqrt{Hz}$ in the band of 1 kHz. A target frequency band of a low magnetic field MRI may be a several to hundreds of Hertz band. In the target frequency band, the magnetic field sensitivity of the LTS SQUID may be 10 $fT/\sqrt{Hz}$ or less. The LTS SQUID exhibits physically and chemically very stable characteristics during a long-term operation under a low-temperature state or repetitive thermal cycling between a high temperature and a room temperature.

According to a modified embodiment of the present invention, the SQUID 140 may be a high-temperature superconductor SQUID (HTS SQUID). The HTS SQUID may be made of ceramic-based yttrium-barium-copper-oxide (YBCO). Magnetic field sensitivity of the HTS SQUID may be about 20-100 $fT/\sqrt{Hz}$ in the band of several to hundreds of Hertz band. In terms of physical and chemical stability, the HTS SQUID may be less than the LTS SQUID.

A flux transformer may improve the sensitivity of the SQUID 140. The flux transformer may include a pick-up coil 172 configured to detect a magnetic flux and an input coil (not shown) configured to amplify the magnetic flux. The flux transformer may be made of superconductor. Preferably, the pick-up coil 172 has a large area to detect more magnetic flux. The input coil may have a similar area to the SQUID 140 to focus a magnetic flux on the SQUID 140 and may be wound many times to amplify the magnetic flux. The pick-up coil 172 may include a magnetometer or a gradiometer. The magnetometer consists of a one-turn coil and transfers the detected magnetic flux to the SQUID 140 after amplifying the detected magnetic flux by the number of coil turns. The gradiometer consists of two coils with opposite turn directions. Thus, the gradiometer is insensitive to uniform magnetic fields. However, the gradiometer detects a difference between magnetic fluxes taken by two coils with respect to a magnetic flux gradient and transfers the difference to the input coil. The pick-up coil 172 may be a pair of gradiometers. Accordingly, the pick-up coil 172 may include first to fourth loops 172a-172d. The type of the pick-up coil 172 may be modified variously.

The prepolarization coil 140 may be disposed to cover the inner concave part 112. A portion or the entirety of the pick-up coil 172 may be disposed between the prepolarization coil 140 and the inner concave part 112. The Dewar 102 including the outer concave part 124 may provide a structure where the pick-up coil 172 fully covers the sample 160. The prepolarization coil 140 may provide a distance short enough to pre-polarize the sample 160. The center of the pick-up coil 172 may not necessarily match that of the sample 160.

The prepolarization coil 140 may include superconductor. The prepolarization coil 140 may be made of a strip conductor or a wire conductor. If the prepolarization coil 140 is made of a strip conductor, the conductor may have a multi-layer structure.

Superconductor is a material that exhibits zero resistance below a certain critical temperature. Accordingly, the prepolarization coil 140 may be fabricated using superconductor, and the prepolarization coil 140 may operate below the critical temperature. In this case, the prepolarization coil 140 does not suffer from the problem of excessive refrigerant consumption Joule heating. Moreover, since the current density of a superconductor may be hundreds of times greater than that of a typical copper conductor, a larger magnetic field may be generated with a small number of coil turns. In addition, the volume of a prepolarization coil may decrease, compared to coils made of copper conductor. The superconducting prepolarization coil 140 may operate at a temperature of liquid helium, irrespective of whether a material of the superconducting prepolarization coil 140 is a high-temperature superconductor or a low-temperature superconductor. Thus, if a prepolarization coil is made of a superconductor, a prepolarization coil-SQUID integrated system may be implemented. That is, one Dewar may operate both the prepolarization coil 140 and the SQUID 150.

If a prepolarization coil-SQUID integrated system is implemented using a prepolarization coil made of copper conductor, a liquid refrigerant may cause vibration while boiling by absorbing heat of the prepolarization coil. The vibration may be transferred to a SQUID to deteriorate operating characteristics of the SQUID.

If a prepolarization coil-SQUID integrated system is implemented using a prepolarization coil made of copper conductor, a separate Dewar may be provided to cool the prepolarization coil. However, use of the separate Dewar results in increased system complexity and higher costs.

However, if the prepolarization coil is made of a superconductor, vibration may be sufficiently reduced due to significantly lower heat production of the prepolarization coil. In addition, the prepolarization coil and the SQUID may be integrally manufactured to reduce system complexity and costs.

Figure 2:
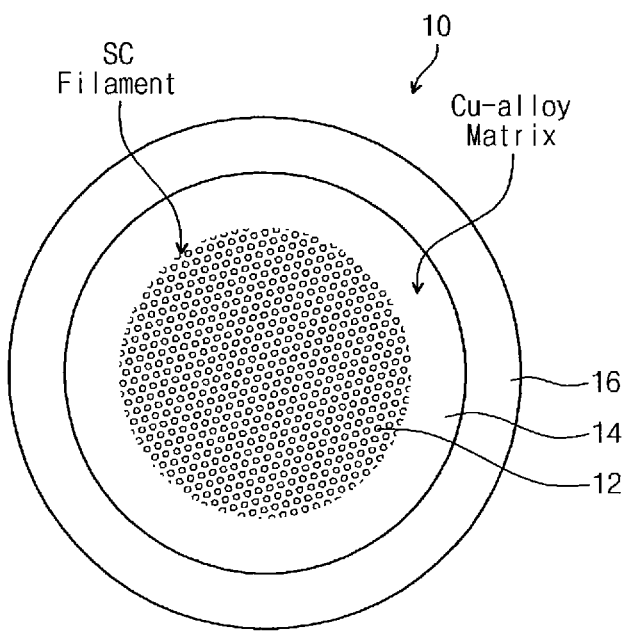
FIG. 2 illustrates a structure of a superconductor comprising a prepolarization coil according to one embodiment of the present invention.

FIG. 2 illustrates a structure of a superconductor wire constituting a prepolarization coil according to one embodiment of the present invention.

Referring to FIG. 2, superconductor wire constituting a prepolarization coil should retain its characteristics with varying current and minimize AC heat loss which occurs with the current variation. In this regard, a prepolarization coil 10 may have a shape where fine superconductor filaments 12 are tightly embedded in a matrix 14.

The smaller the diameter of the superconductor filament 12 is, the less the AC heat loss caused by magnetization hysteresis becomes. The matrix 14 may consist of copper alloy such as CuNi and CuMn. With copper alloy, at 4.2 K which is the vaporization point of liquid helium at sea level, resistivity of the copper alloy is about thousand times higher than that of pure copper. Thus, the matrix 14 may rapidly reduce eddy current generated by change of current. Moreover, coupling loss between the superconductor filaments 12 caused by the change of current may be minimized.

The superconductor filament 12 may be a low-temperature superconductor. The superconductor filament 12 may include at least one of NbTi, $Nb_3Sn$, and $MgB_2$. A metal skin 16 may be disposed to cover the matrix 14. Thermal conductivity and electrical conductivity of the metal skin 16 may be better than those of the matrix 14. Accordingly, when a superconductor quenching phenomenon occurs, the metal skin 14 may prevent diffusion of the phenomenon and rapidly restore superconductivity.

For example, the prepolarization coil 10 may have the shape where NbTi superconductor filaments with thickness of 0.14 microns may be tightly embedded in a copper-nickel alloy matrix 14. A conductor thickness of the prepolarization coil 10 may be about 0.2 millimeter (mm), and the total volume thereof may be about 200 $cm^3$. Rising and falling times of current are 5 milliseconds (msec), respectively. A current pulse of maximum 1000 amperes (A) may be applied to the prepolarization coil 10 to generate a magnetic field of 0.5 Tesla. In this case, maximum estimated heat loss may be 40 mJ per pulse. When the pulse is applied once every four seconds, average of the estimated AC heat loss is 108 mW.

On the other hand, heat loss of a prepolarization coil made of resistive conductor having a total resistance of 0.58 ohm at 77 K may be 1 kW when a current of 40 A is applied to generate 0.2 T. Heat loss of a superconducting prepolarization coil is merely 1/100000 that of the resistive prepolarization coil. Accordingly, the superconducting prepolarization coil has little adverse effect on a SQUID in a liquid helium Dewar and keeps the amount of vaporization of liquid helium negligible.

Figure 3:
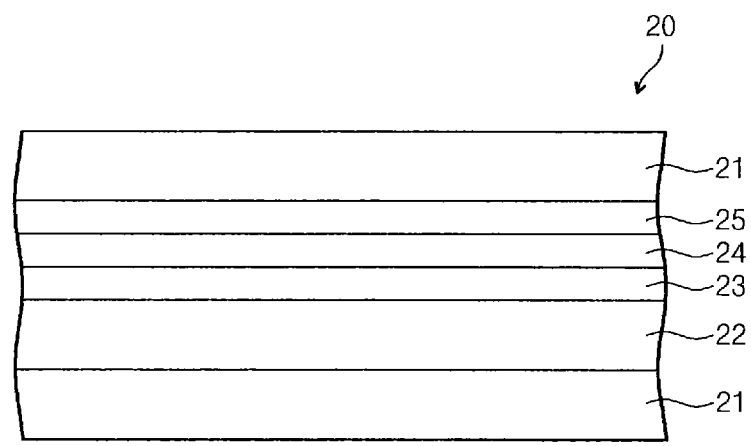
FIG. 3 illustrates a structure of a superconductor comprising a prepolarization coil according to another embodiment of the present invention.

FIG. 3 illustrates a structure of superconductor strip constituting a prepolarization coil according to another embodiment of the present invention.

Referring to FIG. 3, the superconductor strip 20 may include a buffer material layer 23, a superconductor 24, a conductive protection layer 25, and a copper stabilizer layer 21 which are sequentially stacked on a substrate material 22. The copper stabilizer layer 21 is disposed to cover the substrate material 22, the buffer material layer 23, the superconductor 24, and the conductive protection layer 25. The substrate material 22 may mainly employ a Hastelloy-based nickel alloy material having a thickness of about 50 um and exhibiting high tensile strength and mechanical stability. The buffer material layer 23 may be formed by stacking a plurality of oxides on the substrate material 22 to thicknesses of 10 to 40 nm to function as a mechanical buffer layer. The oxide may include at least one of $LaMnO_3$, MgO, and $Al_2O_3$. The superconductor 24 may be stacked on the buffer material layer 23 to a thickness of about 1 um. The superconductor 24 may include a YBCO-based classic superconductor. The conductive protection layer 25 may be stacked on the superconductor 24 to a thickness of about 2 um. The conductive protection layer 25 may electrically connect the superconductor 24 and an external conductor to each other. The conductive protection layer 25 should exhibit high corrosion resistance. The conductive protection layer 25 may be made of silver (Ag). The copper stabilizer layer 21 may be in the form of covering the substrate material 22, the buffer material layer 23, the superconductor 24, and the conductive protection layer 25 to a thickness of about 20 um. The copper stabilizer layer 25 may absorb eddy current, which is created when current flowing to the superconductor 24 changes, through resistance heating to reduce AC heat loss of the superconductor 24.

Figure 4:
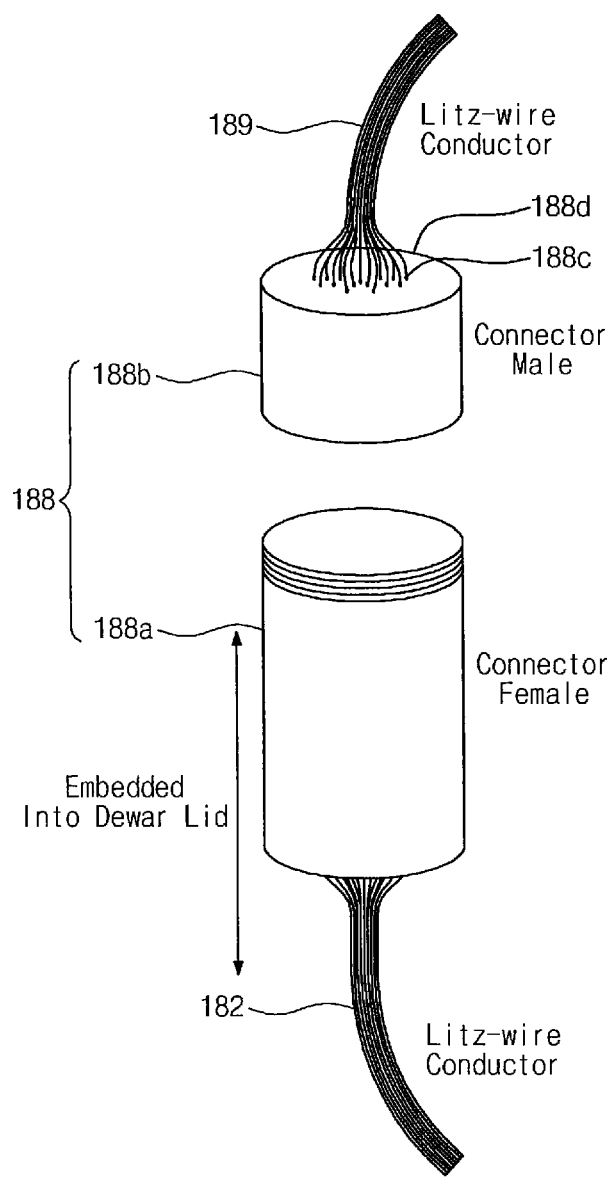
FIG. 4 illustrates a connector according to one embodiment of the present invention.

FIG. 4 illustrates a connector according to one embodiment of the present invention.

Referring to FIGS. 4 and 1, a connector 180 may electrically connect the prepolarization coil 140 and a power supply (not shown) to each other.

The connector 180 may include a first wiring 186 partially immersed in a liquid refrigerant 104 and electrically connected to the prepolarization coil 140, a second wiring 182 electrically connected to the first wiring 186 and disposed inside the inner container 110, a first connector 184 electrically connecting the first wiring 186 and the second wiring 182 to each other, a third wiring 189 electrically connected to the second wiring 182 and disposed outside the Dewar 102, and a second connector 188 electrically connecting the second wiring 182 and the third wiring 189 to each other. The second wiring 182 and the third wiring and 189 may be Litz wire. Each of the second and third wirings 182 and 189 may include a plurality of conductors which may be independently connected through the second connector 188.

The first wiring 186 may be connected to the prepolarization coil 140. One end of the first wiring 186 may be immersed in a liquid refrigerant 104, and the other end thereof may be exposed to the outside of the liquid refrigerant 104. The first wiring 186 may be a high-temperature superconductor. One end of the second wiring 182 may be connected to the other end of the first wiring 186 through the first connector 184. The other end of the second wiring 182 may be connected to the third wiring through the second connector 188. The second wiring 182 and the third wiring 189 may be resistance conductor in form of Litz wire. The resistance conductor may include copper (Cu).

The first wiring 186 may be made of ceramic-based high-temperature superconductor. The first wiring 186 may be configured to prevent heat from outside the Dewar 102, which comes through the second wiring 182, from being transferred to the liquid refrigerant 104 inside the Dewar 102. If the second wiring 182 is composed of a solid wire or a stranded wire, effective AC resistance may increase due to the effect of conductor surface when the amount of current supplied to the prepolarization coil 140 from the power supply changes rapidly. If the second wiring 182 is composed of a solid wire or a stranded wire, an effective cross-sectional area of a conductor may increase in a current-flowing direction. Accordingly, thermal noise (Johnson noise) current generated may increase. A magnetic field generated from the thermal noise current may be picked up by the SQUID 150 as measurement noise. The thinner and the longer a conductor is, the less the thermal noise current becomes. In order to decrease the effective AC resistance and minimize the thermal noise current, the second wiring 181 may be a Litz-wire conductor in which a plurality of conductors are twisted. That is, the second wiring 182 may have minimal electrical resistance and lower thermal conductivity to minimize inflow of heat from the outside of the Dewar. In this case, the number of conductors in the second wiring 182 is large enough to prevent excessive rise of a conductor temperature resulting from resistance heating when maximum current flows.

The second wiring 182 and the third wiring 189 may be configured to minimize generation of thermal noise through the second connector 188. The second connector 188 may include a female connector 188b and a male connector 188a. The second connector 188 may include a plurality of contact pins 188a such that copper conductors 188d constituting the second wiring 182 have independent terminals, which are insulated from each other. The second connector 188 may prevent formation of a short-path conductor loop between copper conductors inside the Dewar and reduce the magnitude of thermal noise. The longer a path of a conductor loop is, the less the magnitude of thermal noise generated becomes. When Litz-wire conductors are all connected through one terminal, a short-path conductor loop may be formed between individual Litz-wire conductors inside the Dewar.

For example, the second wiring 182 and the third wiring 189 may include 200 copper conductors of 0.5 mm thickness. In this case, total effective thickness of the second wiring 182 and the third wiring 189 may be about 8 mm. When a current of 100 A flows through the third wiring 189, Joule heating generated from the third wiring 189 may be about 4.3 W per conductor per meter. The Joule heating may be high enough to increase a conductor temperature of 0.3 degree centigrade per second when cooling is neglected. Considering air cooling of the third wiring 189, practical temperature rise of the third wiring 189 may be negligible.

Figure 5:
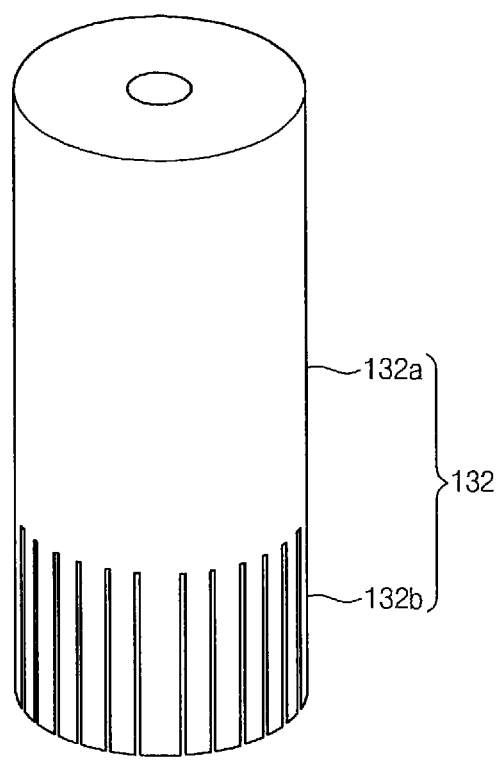
FIG. 5 illustrates a conductive thermal shield layer according to one embodiment of the present invention.

FIG. 5 illustrates a conductive thermal shield layer according to one embodiment of the present invention.

Referring to FIGS. 1 and 5, a thermal shield layer 130 may be combined with an inner neck part 116 to cover an inner body part 114. The thermal shield layer 130 may be of an electrically conductive material. The thermal shield layer 130 may extend to a portion of a side surface of the inner concave part 112. The thermal shield layer 130 may be made of copper or aluminum. One end of the thermal shield layer 130 may be combined with the inner neck part 116, and the other end thereof may have vertical slits. The thermal shield layer 130 may be cylindrical.

The thermal shied layer 130 may include a first thermal shield layer 132 and a second shield layer 134 covering the first thermal shield layer 132. Since the thermal shield layer 130 is an electrically conductive material, inherent thermal noise of the thermal shield layer 130 may have an adverse effect on the SQUID 150 or the pick-up coil 172. Radiation heat collected through the thermal shield layer 130 may be transferred to the inner neck part 116 in the form of conduction heat. The conduction heat transferred to the inner neck part 116 may be cooled by a vaporized liquid refrigerant. Since the thermal shield layer 130 may confer inherent thermal noise to the SQUID 150, the thermal shield layer 130 needs to be limited in use. Accordingly, the conductive thermal shield layer 130 between the sample 160 and the pick-up coil 172 may be partially or entirely removed. Thermal contact between the thermal shield layer 130 and the inner neck part 116 may be improved by clamps 133 and 135. The clamps 133 and 135 may be combined with the thermal shield layer 130 to increase a contact area of the inner neck part 116.

The first thermal shield layer 132 may include a plate part 132a and a strip part 132b. The plate part 132a may be combined with the inner neck part 116 to cover the inner body part 114. The strip part 132b may be consecutively connected to the plate-type part 132a to be disposed around the lower inner body part 114. The plate part 132a may have a cylindrical shape.

According to a modified embodiment of the present invention, the plate part 132a may extend to lower portion of the inner body part 114. The strip part 132b may be disposed between the inner concave part 112 and the outer concave part 124.

Figure 6:
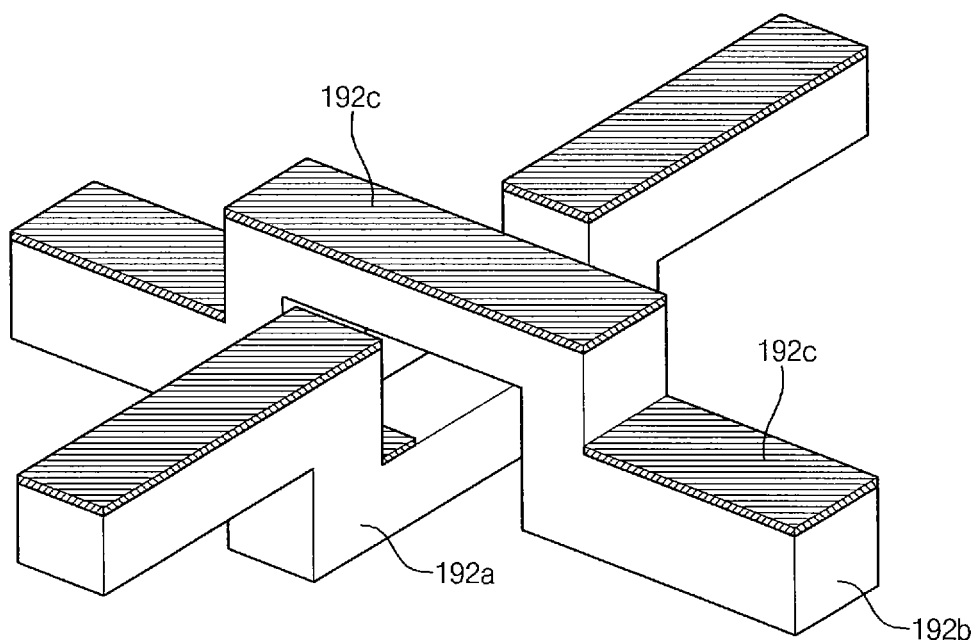
FIG. 6 illustrates a super thermal insulation layer according to one embodiment of the present invention.

FIG. 6 illustrates a node of a super thermal insulation layer 192 according to one embodiment of the present invention.

Referring to FIGS. 1 and 6, the super thermal insulation layer 192 may include filament fibers 192a and 192b and an anisotropic electrically conductive material 192c deposited on the filament fibers 192a and 192b. The anisotropic electrically conductive material 192c may have an electrically conductive region intermittently formed according to waviness of the filament fibers 192a and 192b.

A super thermal insulation layer 192 may be disposed between the inner concave part 112 and the outer concave part 124. The super thermal insulation layer 192 may extend to cover the inner body part 114. The super thermal insulation layer 192 may be disposed in the thermal insulation layer. Accordingly, the super thermal insulation layer 192 may prevent heat from the outside of the Dewar 102 from being transferred to the inside of the Dewar 102 via radiation. The super thermal insulation layer 192 may be an electrically non-conductive material.

According to a modified embodiment of the present invention, the super thermal insulation layer 192 may be divided into a plurality of lattices such that its surfaces are electrically insulated from each other. The super thermal insulation layer 192 may include aluminum Mylar. The super thermal insulation layer 192 may include a plurality of aluminum-Mylar laminated films.

The thermal shield layer 130 might not necessarily be disposed between the sample 160 and the pick-up coil 172. Instead, only the super thermal insulation layer 192 may be disposed therebetween. In such a case, the pick-up coil 172 may be less affected by thermal noise caused by the conductive thermal shield layer 130.

The magnetization strength of the sample 160 may vary depending on a distance between the sample 160 and the prepolarization coil 140 and their arrangement. In addition, the intensity of a signal may vary depending on the distance between the sample 160 and the pick-up coil 172. Thus, a spatial arrangement of a sample and a prepolarization coil and a spatial arrangement of the sample and a pick-up coil may have a significant effect on performance of a low magnetic field MRI system.

A cooling apparatus according to one embodiment of the present invention may be applied to a SQUID-superconducting prepolarization coil integrated low magnetic field MRI system employing a superconducting prepolarization coil. In this case, the Meissner effect caused by the prepolarization coil may have a magnetic effect on the SQUID. Thus, an arrangement of the prepolarization coil and a shape of the Dewar may have an important effect on the performance of the system.

When the SQUID-superconducting prepolarization coil integrated low magnetic field MRI system is applied to a conventional-type Dewar, a sample is disposed at the off-center position in the prepolarization coil. Thus, the above structure may not be suitable for a low magnetic field MRI system.

The Dewar needs to be optimized to allow the SQUID-prepolarization coil integrated low magnetic field MRI system to operate with optimal performance. Specifically, the optimized Dewar is a concave-type Dewar including an inner concave part and an outer concave part. The concave Dewar may have advantages, as set forth below.

First, in case of a flat or protrusive Dewar, a sample is disposed at an off-center position with respect to a prepolarization coil. Thus, the magnetization strength of the sample is lowered. Meanwhile, in case of a concave Dewar, the sample is disposed inside a concavely recessed space in the shape of a cylinder. In addition, the prepolarization coil may be disposed to surround the cylindrical recessed space. Thus, the sample may be disposed in the center inside the cylindrical space to increase the magnetization strength of the sample.

Second, the intensity of a nuclear magnetic resonance (NMR) signal of a sample is in proportion to the distance between the sample and a pick-up coil. In case of a protrusive Dewar and a flat Dewar, a thermal insulation layer of the Dewar adjacent to a sample should be thin as possible to increase the intensity of the NMR signal. A protrusive Dewar and a flat Dewar require a minimum thickness of a thermal insulation layer to stably maintain a temperature difference of about 300 K. In general, a protrusive Dewar and a flat Dewar require a thickness of an FRP material (about 8-10 mm) used in an inner container and an outer container and a thickness of a vacuum thermal insulation layer (about 8-10 mm) between the inner and outer containers where a thermal shied layer and a super thermal insulation layer are disposed. Accordingly, in case of a protrusive Dewar and a flat Dewar, the sample and the pick-up coil are spaced apart from each other by the thickness of the thermal insulation layer. However, in case of a concave Dewar, a sample and a pick-up coil can be disposed coplanarly. Accordingly, since the sample and the pick-up coil have no distance difference in a perpendicular direction, signal attenuation resulting from the distance between the sample and the pick-up coil may be suppressed. Moreover, a thickness (d) of the thermal insulation layer at a portion adjacent to the sample and the pick-up coil may be relatively greater than that of a protrusive Dewar or a flat Dewar. Accordingly, the difficulty of manufacturing of the concave Dewar may be reduced. Specifically, a thickness of the inner concave part, a thickness of the outer concave part, and a thickness of the thermal insulation layer between the inner concave part and the outer concave part may be decreased.

Third, in case of a concave Dewar, a solid angle of radiation heat emitted to the concave part is small. Thus, less radiation heat is introduced. A concave cylinder portion where a sample is disposed is surrounded by a portion filled with liquid helium. Accordingly, an inner concave part of the concave Dewar is relatively less exposed to room temperature and receives less radiation heat compared to a protrusive Dewar or a flat Dewar.

In case of a protrusive Dewar or a flat Dewar, an electrically conductive thermal shield layer may be removed from the region facing a sample and a pick-up coil. Thus, the sample-facing region receives more radiation heat than the other regions. Meanwhile, in case of a concave Dewar, a region facing a sample and a pick-up coil have sufficient space to secure a thermal insulation layer to minimize the introduction of the radiation heat.

FIGS. 7 to 10 illustrate magnetic filed measuring apparatuses according to embodiments of the present invention, respectively. Duplicate explanations as those described in FIG. 1 will be omitted.

Figure 7:
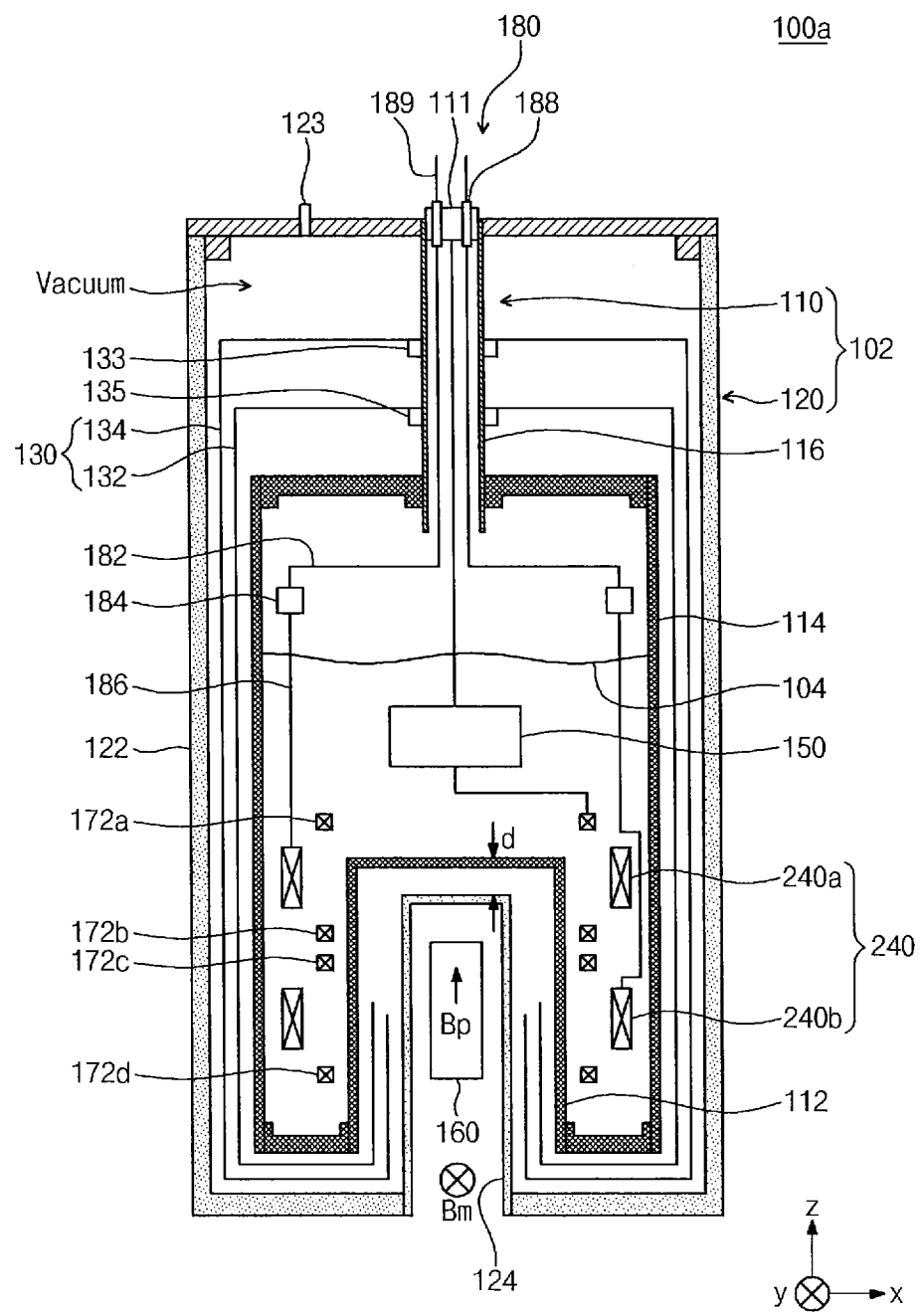
FIGS. 7 to 10 illustrate magnetic filed measuring apparatuses according to embodiments of the present invention, respectively.

Referring to FIG. 7, a prepolarization coil 240 is provided in the form of Helmholtz coil. A prepolarization magnetic field Bp generated by the prepolarization coil 240 may be paraxial to an inner concave part 112. The prepolarization coil 240 may include a first prepolarization coil 240a and a second prepolarization coil 240b. The first prepolarization coil 240a and the second prepolarization coil 240b may have the same shape and may be disposed to be spaced apart from each other. The first prepolarization coil 240a and the second prepolarization coil 240b may be connected in series or parallel. The first prepolarization coil 240a and the second prepolarization coil 240b may be disposed to cover the inner concave part 112.

According to a modified embodiment of the present invention, the prepolarization coil 240 is not limited to the form of Helmholtz coil. Thus, the prepolarization coil 240 may include one or more coils connected in series and/or parallel.

Figure 8:
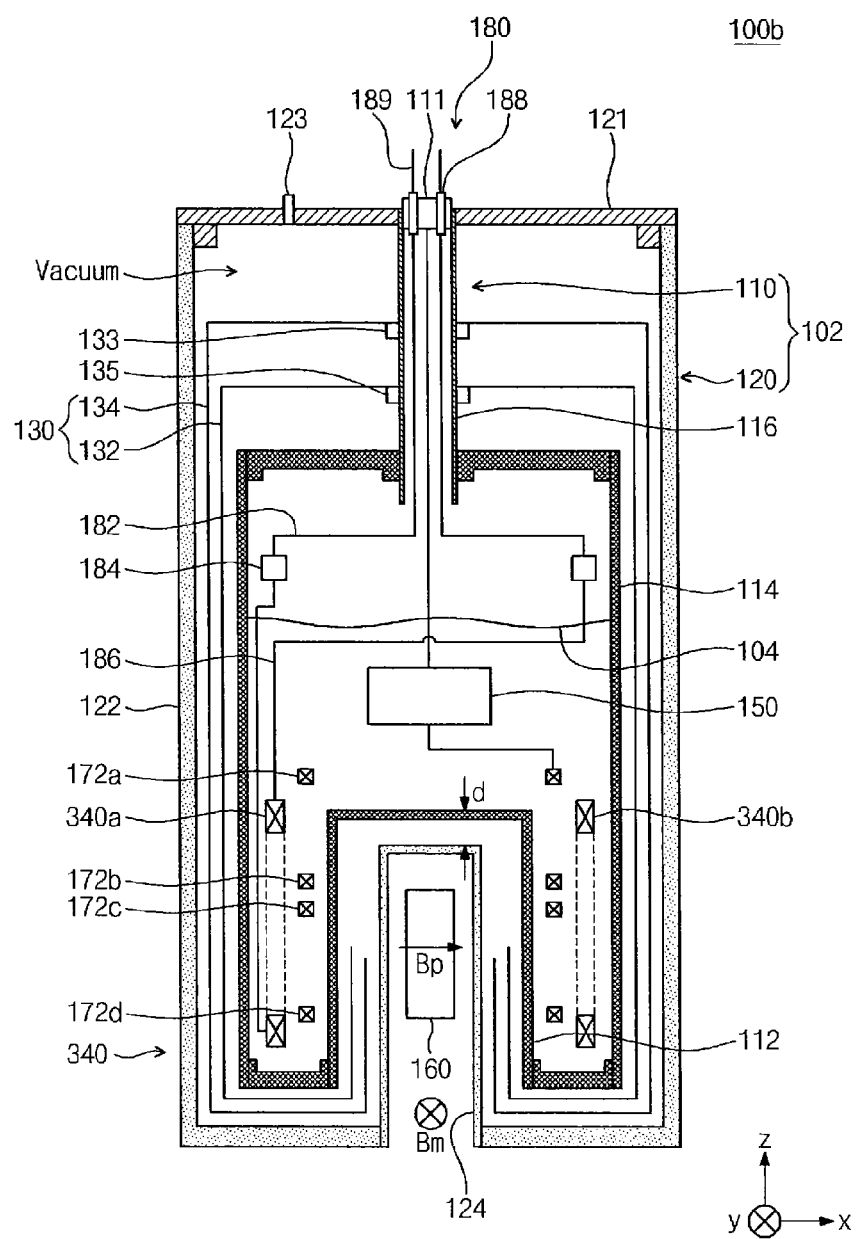

Referring to FIG. 8, a prepolarization coil 340 may be provided in the form of Helmholtz coil, and a prepolarization magnetic field Bp generated by the prepolarization coil 340 may be in a direction perpendicular to the central axis of an inner concave part 112. The prepolarization coil 340 may include a first prepolarization coil 340a and a second prepolarization coil 340b. The first prepolarization coil 340a and the second prepolarization coil 340b may be disposed to be spaced apart from each other around the inner concave part 112. The first prepolarization coil 340a and the second prepolarization coil 340b may be connected in serial or parallel.

According to a modified embodiment of the present invention, the prepolarization coil 340 is not limited to the form of Helmholtz coil. Thus, the prepolarization coil 340 may include one or more coils connected in series and/or parallel.

Figure 9:
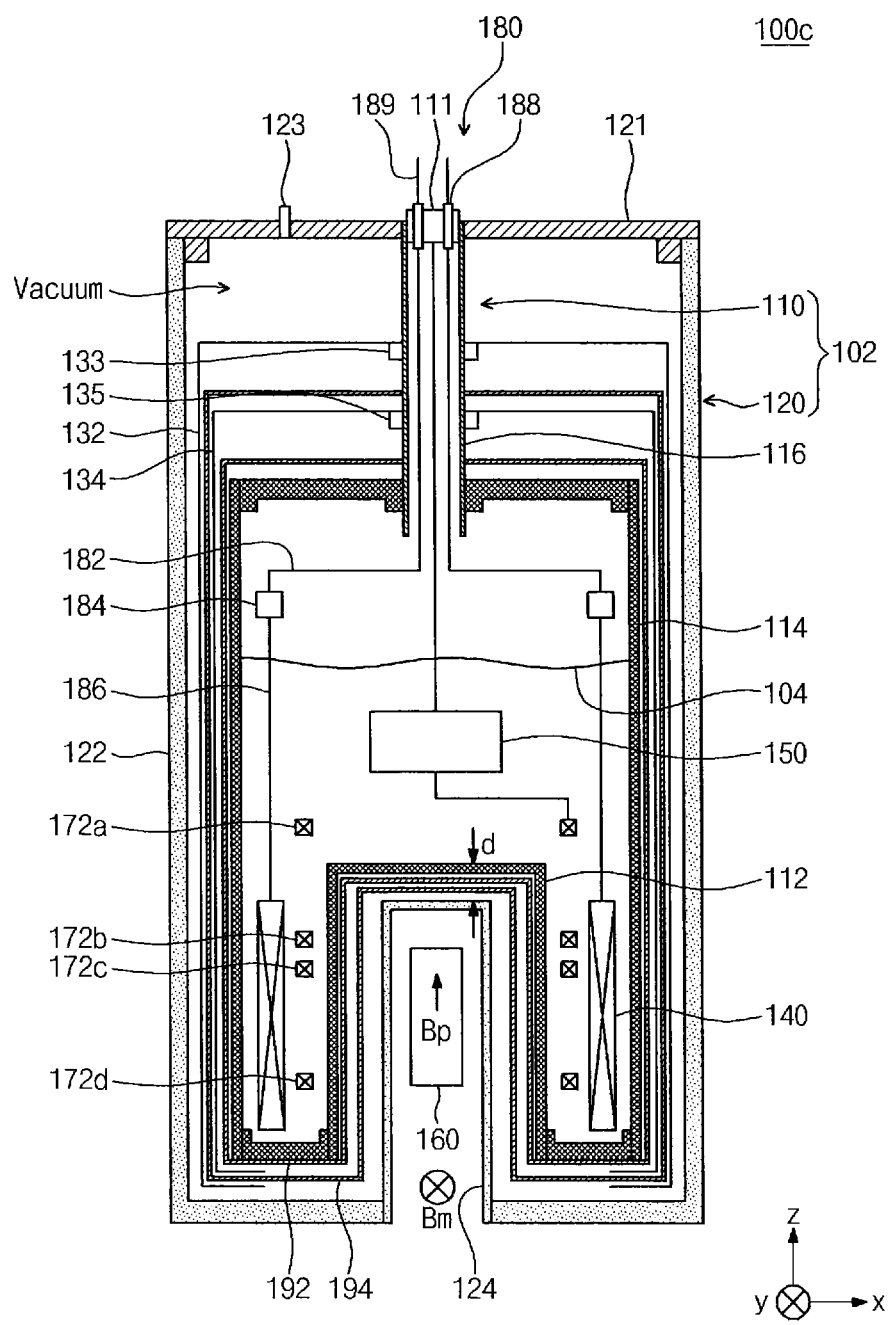

Referring to FIG. 9, super thermal insulation layers 192 and 194 may be disposed between the thermal shield layers 132 and 134.

Figure 10:
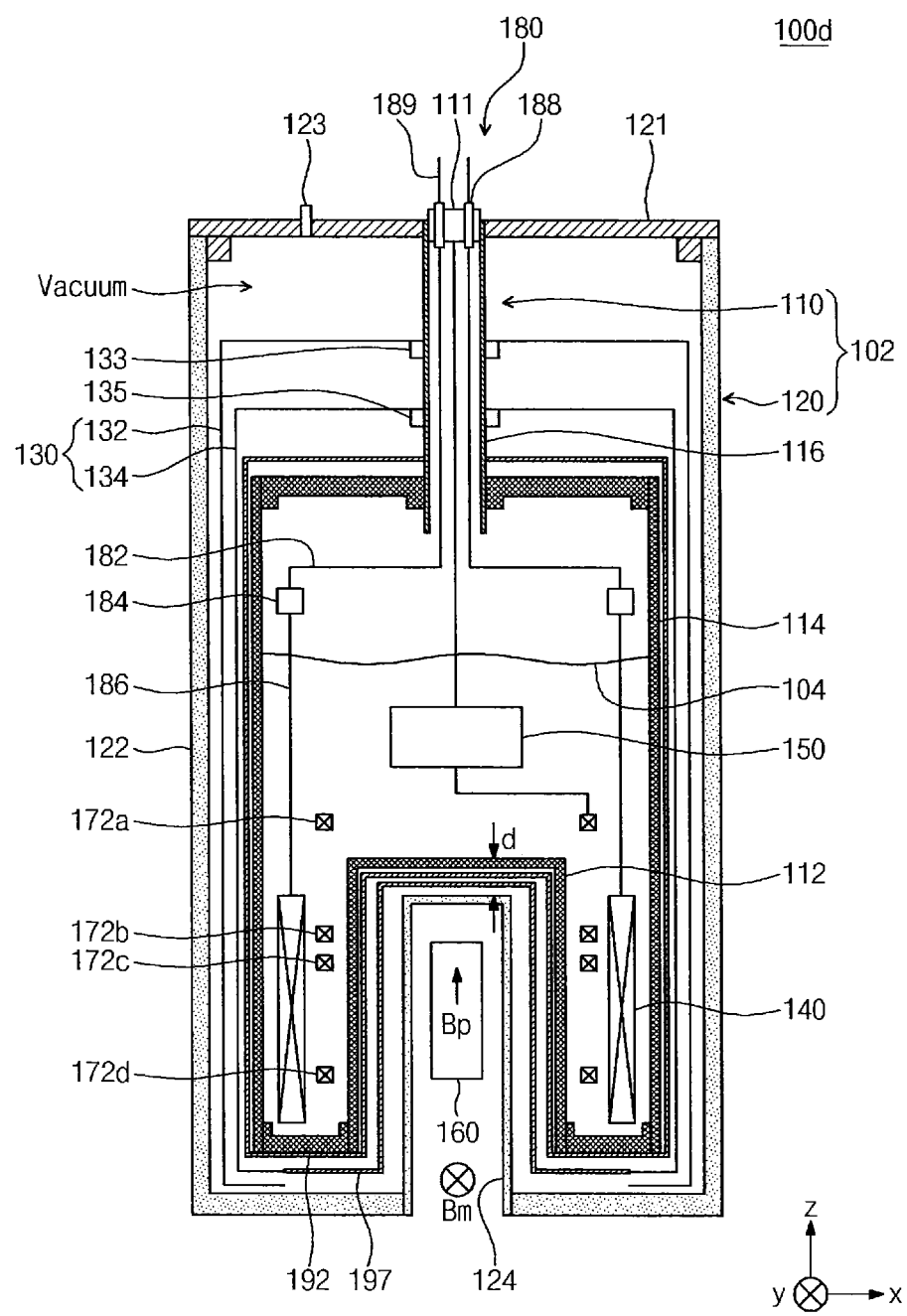

Referring to FIG. 10, an auxiliary thermal shield layer 197 may be an electrically non-conductive material combined with a thermal shield layer 130 and disposed between an inner concave part 112 and an outer concave part 124. The auxiliary thermal shield layer 197 may include electrically non-conductive metal oxide. Specifically, the auxiliary thermal shield layer 197 may include at least one of aluminum oxide (alumina), aluminum nitride, and boron nitride.

A Dewar uses a thermal shield layer to structurally minimize thermal noise. Conventionally, a thermal shield layer is not used in a region adjacent to a sample and a pick-up coil. Instead of the thermal shield layer, a super thermal insulation layer is used to block radiation heat. However, it is difficult to obtain sufficient thermal insulation effect. Accordingly, a non-metallic auxiliary thermal shield layer is required to block the radiation heat introduced into the Dewar. The auxiliary thermal shield layer may be a non-metallic material preventing thermal noise and magnetic noise from reaching a SQUID while having high thermal conductivity.

However, since most non-metallic materials have low thermal conductivity, they may poorly function as thermal shield layers. Aluminum oxide (alumina) is a ceramic-based non-metallic material, but has high thermal conductivity of about 30 W/mK at 300 K and about 1.7 W/mK at 5 K. Conventional metallic thermal shield layer is disposed in a region where a distance between the pick-up coil and the sample is far away. For this reason, the auxiliary thermal shield layer may be disposed in a region near the pick-up coil and the sample. Since the auxiliary thermal shield layer and the thermal shield layer may be in reliable contact with each other, they may block externally introduced radiation heat and suppress thermal noise caused by a metallic thermal shield layer.

Figure 11:
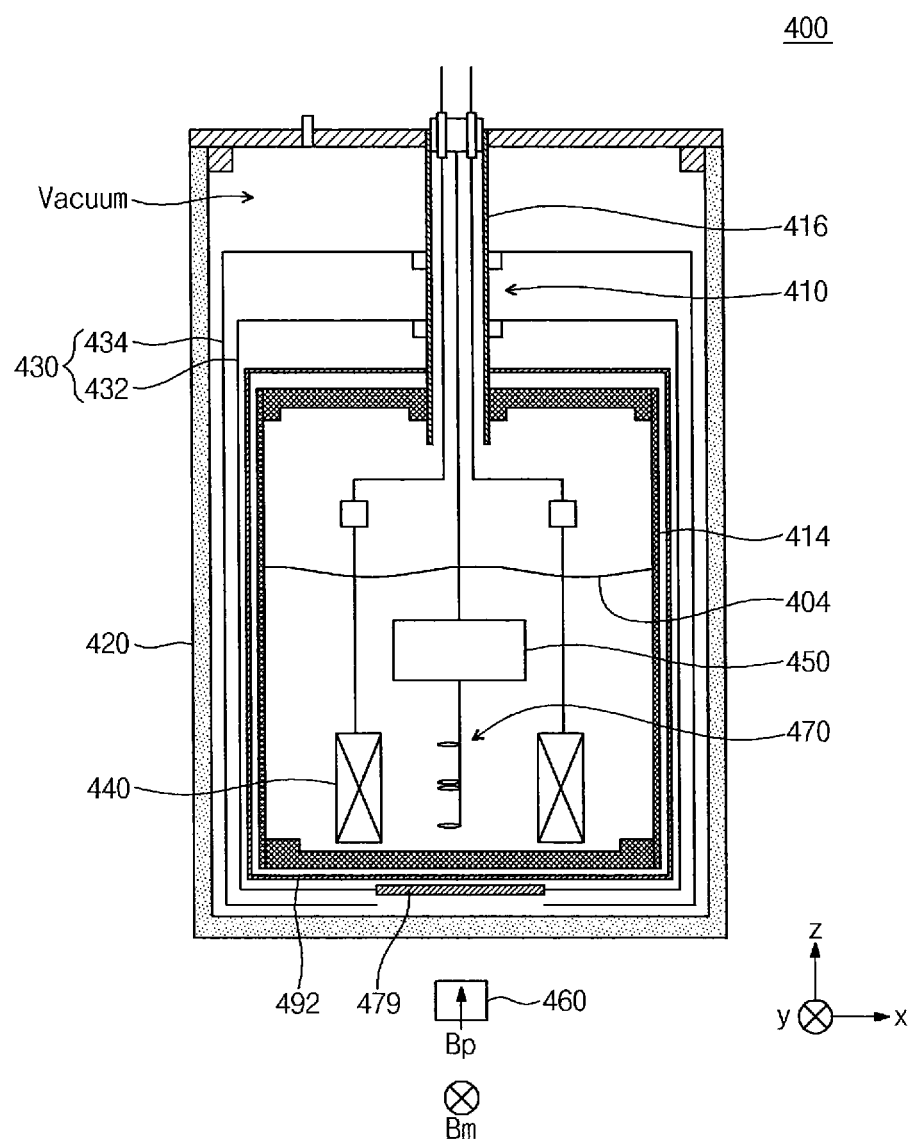
FIG. 11 illustrates a cooling apparatus according to another embodiment of the present invention.

FIG. 11 illustrates a cooling apparatus 400 according to another embodiment of the present invention.

Referring to FIG. 11, the cooling apparatus 400 may include an outer container 420 and an inner container 410. The inner container 410 may be disposed inside the outer container 420 and include an inner neck part 416 and an inner body part 414. An electrically conductive thermal shield layer 430 may be connected to the inner neck part and disposed to cover at least a side surface of the inner body part 414. An auxiliary thermal shield layer 479 may be disposed in contact with the thermal shield layer 430 in a region adjacent to a sample 460 disposed below the outer container 412. The auxiliary thermal shield layer 479 may be made of aluminum oxide. A gap between the outer container 420 and the inter container 410 is functioned as a thermal insulation layer in vacuum. The inner container 410 may include a liquid refrigerant 404.

Lower surfaces of the outer container 420 and the inner container 410 may be flat. A prepolarization coil 440, a SQUID 450, and a pick-up coil 470, which are each made of superconductor, may be disposed inside the liquid refrigerant 404. A super thermal insulation layer 492 may be disposed to cover the inner body part 414.

Figure 12:
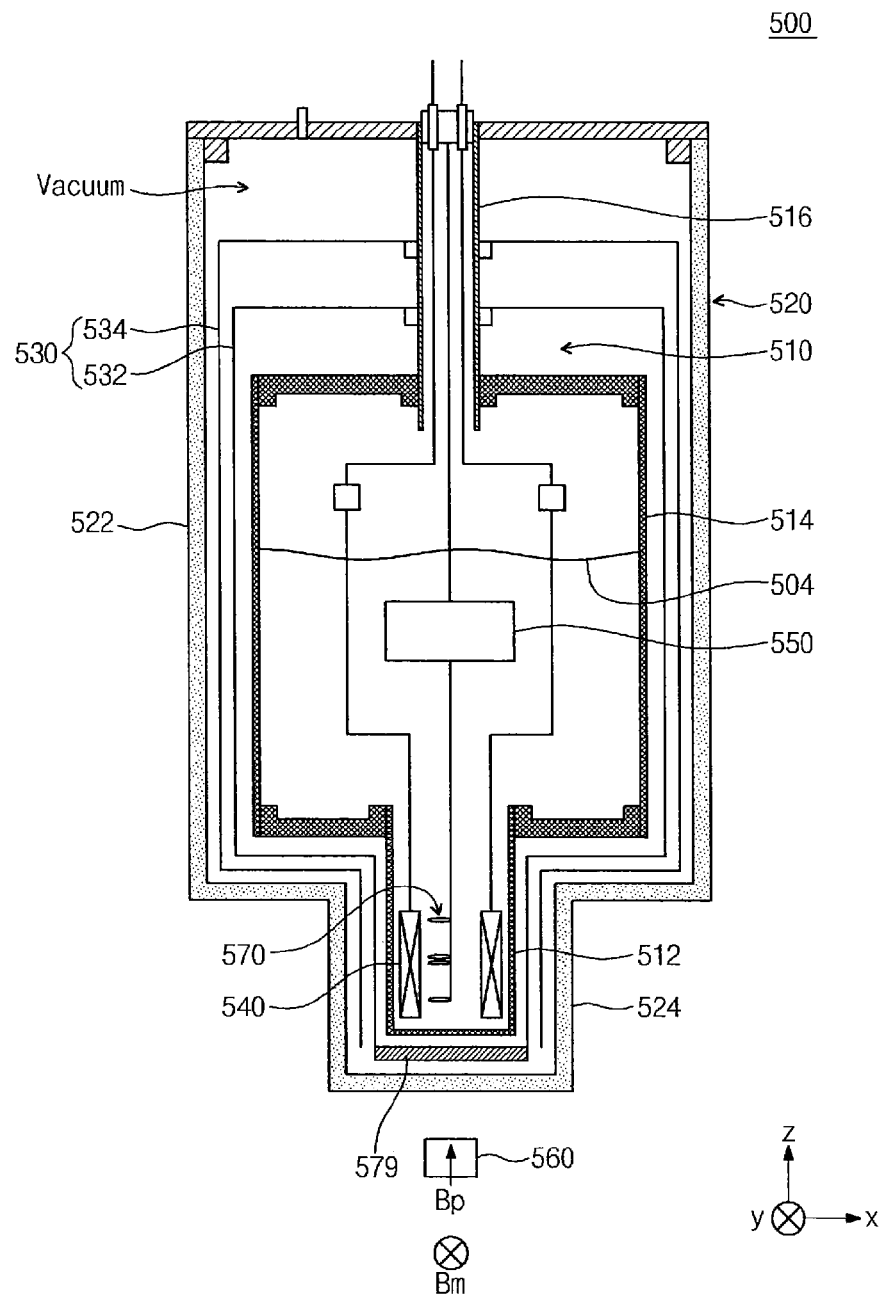
FIG. 12 illustrates a cooling apparatus according to further another embodiment of the present invention.

FIG. 12 illustrates a cooling apparatus 500 according to further another embodiment of the present invention.

Referring to FIG. 12, the cooling apparatus 500 may include an outer container 520 and an inner container 510. The inner container 510 may be disposed inside the outer container 520 and include an inner neck part 516 and an inner body part 514. An electrically conductive thermal shield layer 530 may be connected to the inner neck part 516 and disposed to cover at least a side surface of the inner body part 514. An auxiliary thermal shield layer 579 may be disposed in contact with the thermal shield layer 530 in a region adjacent to a sample 560 disposed below the outer container 512. The auxiliary thermal shield layer 579 may be made of aluminum oxide. A gap between the outer container 520 and the inner container 510 is functioned as a thermal insulation layer in vacuum. The inner container 510 may include a liquid refrigerant 504.

The outer container 520 may include an outer protrusive part 524 and an outer body part 522. The inner container 510 may include an inner protrusive part 512. The inner protrusive part 512 may be disposed inside the outer protrusive part 524. The auxiliary thermal shield layer 579 may be disposed between a lower surface of the inner protrusive part 512 and a lower surface of the outer protrusive part 524. A prepolarization coil 540 and a pick-up coil 570, which are each made of superconductor, may be disposed inside the inner protrusive part 512. A super thermal insulation layer (not shown) may be disposed to cover the inner body part 514.

As described above, a low-noise cooling apparatus according to one embodiment of the present invention can be applied to a low-noise magnetic field MM. The low-noise cooling apparatus provides an integrated system where a prepolarization coil and a SQUID are mounted inside a single Dewar. By employing a superconducting line material, the prepolarization coil can overcome the problem of excessive Joule heating. In addition, a concave Dewar structure can increase the magnetization strength of a sample and improve signal sensitivity.

A low-noise cooling apparatus according to another embodiment of the present invention includes an electrically non-conductive auxiliary thermal shield layer to overcome the problem of thermal noise induction. As a result, the low-noise cooling apparatus can prevent thermal noise caused by metallic thermal shield layers from contributing to a SQUID.

Although the present invention has been described in connection with the embodiment of the present invention illustrated in the accompanying drawings, it is not limited thereto. It will be apparent to those skilled in the art that various substitutions, modifications and changes may be made without departing from the scope and spirit of the present invention.

What is claimed is:

1. A low-noise cooling apparatus comprising:
   a Dewar including an outer container and an inner container containing a liquid refrigerant;
   a prepolarization coil disposed inside the inner container and immersed in the liquid refrigerant;
   a pick-up coil immersed in the liquid refrigerant; and
   a superconducting quantum interference device (SQUID) electrically connected to the pick-up coil and immersed in the liquid refrigerant,
   wherein the prepolarization coil is made of a superconductor,
   wherein a gap between the outer container and the inner container is functioned as a thermal insulation layer in vacuum,
   wherein a sample is magnetized by the prepolarization coil and becomes a measurement target of the pick-up coil, and
   wherein the Dewar has a concave shape with a recessed space in which the sample is disposed.

2. The low-noise cooling apparatus of claim 1, wherein the outer container includes:
an outer body part; and
an outer concave part surrounding the sample such that the sample is disposed in the center of a region in which the prepolarization coil is disposed, and
wherein the inner container includes:
an inner neck part combined with the outer container;
an inner body part connected to the inner neck part; and
an inner concave part connected to the inner body part to cover the outer concave part and disposed around the outer concave part.

3. The low-noise cooling apparatus of claim 2, further comprising:
at least one conductive thermal shield layer combined with the inner neck part to cover the inner body part.

4. The low-noise cooling apparatus of claim 3, wherein the conductive thermal shield layer includes:
a plate-type part combined with the inner neck part to cover the inner body part; and
a strip part continuously connected to the plate-type part cover the lower part of the inner body part.

5. The low-noise cooling apparatus of claim 3, further comprising:
at least one super thermal insulation layer disposed between the inner concave part and the outer concave part and covering the outer concave part.

6. The low-noise cooling apparatus of claim 5, wherein the super thermal insulation layer includes:
a filament fiber; and
an anisotropic electrically conductive material deposited on the filament fiber and having an electrically conductive region intermittently formed according to waviness of the filament fibers.

7. The low-noise cooling apparatus of claim 3, further comprising:
at least one electrically non-conductive auxiliary thermal shield layer combined with the thermal shield layer and disposed between the inner concave part and the outer concave part.

8. The low-noise cooling apparatus of claim 7, wherein the electrically non-conductive auxiliary thermal shield layer includes at least one of alumina, aluminum nitride, and boron nitride.

9. The low-noise cooling apparatus of claim 2, wherein the prepolarization coil is disposed to cover the inner concave part, and a portion or the entirety of the pick-up coil is disposed between the prepolarization coil and the inner concave part.

10. The low-noise cooling apparatus of claim 2, wherein the prepolarization coil includes one or more coils connected in series or parallel, and a prepolarization magnetic field generated by the prepolarization coil is in a direction perpendicular to the central axis of the inner concave part.

11. The low-noise cooling apparatus of claim 2, wherein the prepolarization coil includes one or more coils connected in series or parallel, and a prepolarization magnetic field generated by the prepolarization coil is paraxial to the inner concave part.

12. The low-noise cooling apparatus of claim 1, wherein the prepolarization coil includes:
an alloy-material matrix of high resistance; and
a plurality of fine superconductor filaments embedded in the matrix.

13. The low-noise cooling apparatus of claim 12, wherein each of the superconductor filaments includes at least one of NbTi, $Nb_3Sn$, and $MgB_2$.

14. The low-noise cooling apparatus of claim 1, further comprising:
a connector electrically connecting the prepolarization coil and a power supply to each other,
wherein the connector includes:
a first wiring made of a superconductor partially immersed in the liquid refrigerant and electrically connected to the prepolarization coil; and
a second wiring electrically connected to one end of the first wiring exposed from the liquid refrigerant and exposed from the refrigerant, and
wherein the second wiring being a solid-wire, stranded-wire or Litz-wire resistive conductor.

15. A low-noise cooling apparatus comprising:
an outer container;
an inner container disposed inside the outer container and including an inner neck part and an inner body part;
at least one conductive thermal shield layer connected to the inner neck part and disposed to cover at least a side of the inner body part;
an electrically non-conductive auxiliary thermal shield layer disposed in contact with the conductive thermal shield layer in a region adjacent to a sample disposed below the outer container;
a prepolarization coil disposed inside the inner container and immersed in a liquid refrigerant;
a pick-up coil disposed paraxial to the prepolarization coil and immersed in the liquid refrigerant; and
a superconducting quantum interference device (SQUID) electrically connected to the pick-up coil and immersed in the liquid refrigerant,
wherein a gap between the outer container and the inner container is functioned as a thermal insulation layer in vacuum.

16. The low-noise cooling apparatus of claim 15, wherein the outer container further includes an outer protrusive part, and the inner container further includes an inner protrusive part,
wherein the inner protrusive part is disposed inside the outer protrusive part, and
wherein the auxiliary thermal shield layer is disposed between a lower surface of the inner protrusive part and a lower surface of the outer protrusive part.

17. The low-noise cooling apparatus of claim 15, wherein the outer container further includes an outer concave part, and the inner container further includes an inner concave part,
wherein the outer concave part is disposed inside the inner concave part, and
wherein the auxiliary thermal shield layer is disposed between the outer concave part and the inner concave part.

* * * * *